US008310595B2

(12) United States Patent
Buttimer et al.

(10) Patent No.: US 8,310,595 B2
(45) Date of Patent: Nov. 13, 2012

(54) PHASE DETERMINATION FOR RESAMPLING VIDEO

(75) Inventors: Maurice J. Buttimer, Media, PA (US); Andrew P. Weir, Malvern, PA (US); Michael A. Arnao, Collegeville, PA (US)

(73) Assignee: Cisco Technology, Inc., San Jose, CA (US)

( * ) Notice: Subject to any disclaimer, the term of this patent is extended or adjusted under 35 U.S.C. 154(b) by 1207 days.

(21) Appl. No.: 12/106,995

(22) Filed: Apr. 21, 2008

(65) Prior Publication Data

US 2009/0262244 A1 Oct. 22, 2009

(51) Int. Cl.
*H03M 1/12* (2006.01)

(52) U.S. Cl. ........ 348/572; 348/530; 348/536; 348/537; 348/538; 348/539; 348/540; 348/543; 348/552; 348/501; 348/502; 348/503; 348/508; 348/513; 348/571; 348/573; 348/574; 348/575; 348/180; 331/20; 375/371; 375/376

(58) Field of Classification Search .................. 348/572, 348/530, 536, 537, 538, 539, 540, 543, 552, 348/501, 502, 503, 508, 513, 571, 573, 574, 348/575, 180; 331/20; 375/371, 376
See application file for complete search history.

(56) References Cited

U.S. PATENT DOCUMENTS

| | | | | |
|---|---|---|---|---|
| 5,359,366 | A * | 10/1994 | Ubukata et al. | 348/536 |
| 5,990,968 | A * | 11/1999 | Naka et al. | 348/537 |
| 6,268,848 | B1 | 7/2001 | Eglit | 345/213 |
| 6,323,910 | B1 * | 11/2001 | Clark, III | 348/537 |
| 6,483,447 | B1 * | 11/2002 | Eglit | 341/111 |
| 6,522,365 | B1 * | 2/2003 | Levantovsky et al. | 348/537 |
| 6,633,288 | B2 | 10/2003 | Agarwal et al. | 345/213 |
| 6,686,969 | B1 | 2/2004 | Hara et al. | 348/537 |
| 6,753,872 | B2 * | 6/2004 | Moriwaki et al. | 345/537 |
| 6,933,937 | B2 | 8/2005 | Agarwal et al. | 345/213 |
| 7,061,281 | B2 | 6/2006 | Shih et al. | 327/91 |
| 7,889,825 | B2 * | 2/2011 | Tsai | 375/355 |
| 2001/0008400 | A1 * | 7/2001 | Moriwaki et al. | 345/534 |
| 2003/0156107 | A1 | 8/2003 | Sakashita | 345/213 |
| 2003/0185332 | A1 | 10/2003 | Cheng | 375/376 |
| 2004/0196280 | A1 * | 10/2004 | Yee | 345/418 |

* cited by examiner

*Primary Examiner* — Jefferey Harold
*Assistant Examiner* — Mustafizur Rahman
(74) *Attorney, Agent, or Firm* — Dov Rosenfeld; Inventek

(57) ABSTRACT

A method, and apparatus, and logic encoded in one or more computer-readable media to carry out a method. The method is to sample analog video at a sample clock rate and at a phase selected from a set of phases based on a quality measure determined from the sampled video. The quality measure is based on statistics of pixel to pixel differences in a coordinate of the generated digital video that have a magnitude exceeding a pre-determined threshold.

23 Claims, 6 Drawing Sheets

PHASE DETERMINATION FOR RESAMPLING VIDEO

FIELD OF THE INVENTION

The present disclosure relates generally to generating digital video, and more specifically to generating digital video from analog video in a video teleconferencing terminal.

BACKGROUND

Video display controllers such as a VGA display controller include at least one digital-to-analog converter (DAC) to form one or more analog video signals for display on an analog display monitor. Such a signal typically has the form of steps (treads) that are typically smoothed by a reconstruction filter. It is desired to convert such one or more analog signals to digital form, e.g., in a terminal of a videoconferencing system for compression and transmission to one or more other terminals at remote locations. Such resampling is carried out at sampling points that are ideally positioned at the center of each tread of the DAC output(s) in order to avoid blurring and/or other undesired effects.

The video image from the video display controller may be a static image typical of a desktop on a computer display. Such an image may include one or more windows in which motion video is being displayed.

DESCRIPTION OF EXAMPLE EMBODIMENTS

Overview

Figure 1:
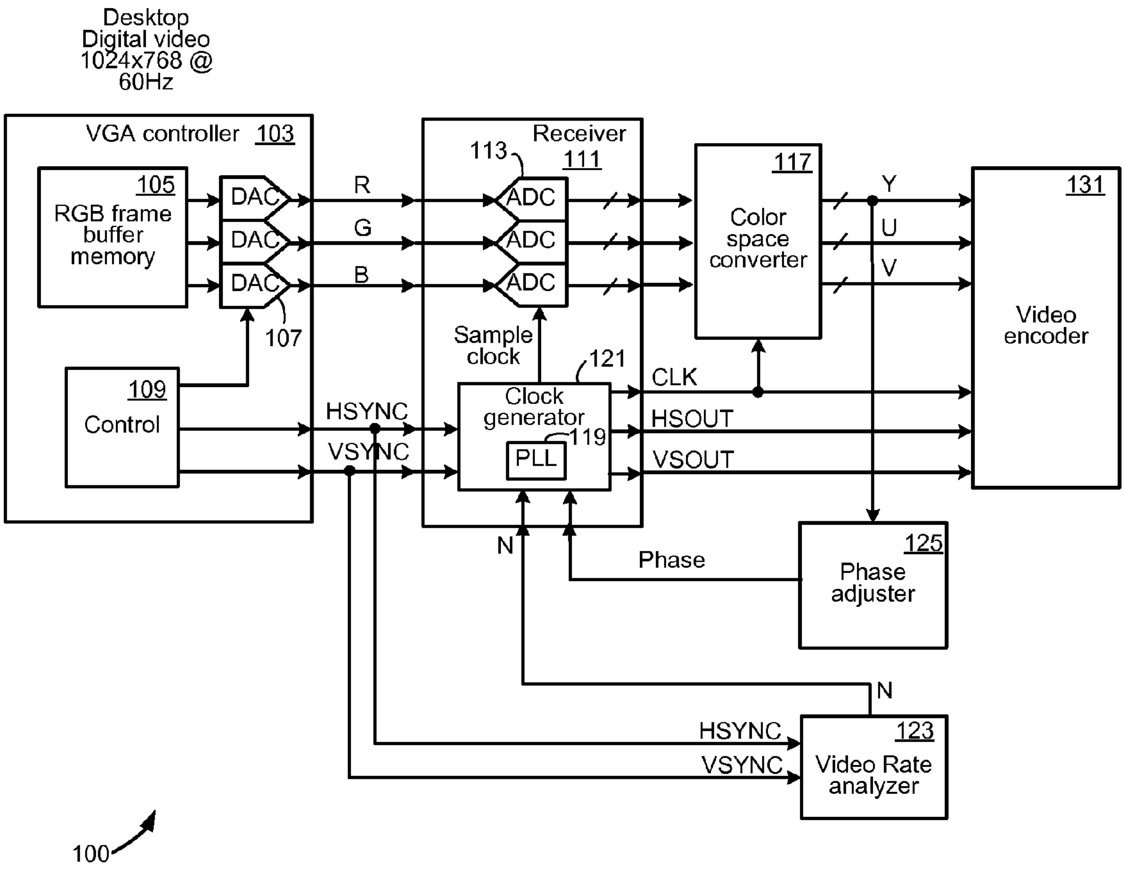
FIG. 1 shows one apparatus embodiment of the invention.

Embodiments of the present invention include a method, and apparatus, and logic encoded in one or more computer-readable medium to carry out a method. The method is to sample analog video at a sample clock rate and at a phase selected from a set of phases based on a quality measure determined from the sampled video. The quality measure is based on statistics of pixel to pixel differences in a coordinate of the generated digital video that have magnitude exceeding a pre-determined threshold.

Particular embodiments include an apparatus comprising a receiver configured to accept analog video from a source of analog video and to output digital video. The source of the analog video includes one or more digital to analog converters and is configured to output the analog video and a horizontal synchronization indication. The receiver is configured to sample the analog video using one or more analog to digital converters at a sample clock rate and sample clock phase. The apparatus further comprises a clock signal generator coupled to the video rate analyzer configured to accept an indication of the number of samples in a video line and a phase signal and generate a sample clock signal at the sample clock rate and sample clock phase for the one or more analog to digital converters. The apparatus further comprises a phase adjuster configured to receive the digital video output from the receiver and to determine the phase signal for the clock signal generator. The phase adjuster is configured to compare statistics of pixel to pixel differences that have a magnitude exceeding a pre-determined threshold for a plurality of different sample clock phases to determine the phase for phase signal for the clock signal generator.

In one version, the analog video includes R, G, and B signals. The receiver is configured to sample R, G, and B values. The apparatus further comprises a color space converter configured to convert the R, G, and B values to coordinates that include an intensity coordinate of an intensity measure, and wherein the phase adjuster is configured to accept the intensity coordinate values and to determine the phase from the intensity coordinate samples.

In one version, the phase adjuster is configured to repeat for a plurality of phase settings: setting the phase, waiting a pre-determined time interval, accepting the intensity coordinate values for at least part of a frame; and determining the statistics from the accepted intensity coordinate values. The phase adjuster is configured to select the phase to use.

Particular embodiments include a method comprising accepting analog video and a horizontal synchronization indication from a source of analog video, and sampling the analog video using one or more analog to digital converters at a sample clock rate and a selected sample clock phase. The sample clock rate is determined as a function of an indication of the number of samples in a video line. The indication of the number of samples in a video line is determined from one or more characteristics of the analog video, including one or more characteristics of the horizontal synchronization indication. The method further comprises outputting digital video from the sampled analog video. The selected sample clock phase is determined using a process that includes accepting digital video output obtained by sampling at the sample clock rate with a plurality of different sample clock phases and comparing statistics of pixel to pixel differences in a coordinate of the accepted digital video output that have magnitude exceeding a pre-determined threshold for the different sample clock phases to determine the selected sample clock phase for the sampling.

Particular embodiments include a method comprising repeating for a plurality of different phase settings determining a respective sampling quality measure; selecting a phase to use based on the determined quality measures for the plurality of phase settings; and setting the phase at the selected phase. The determining of the sampling quality measure includes: setting the phase of a sampling clock to a next phase of the different phase settings; accepting analog video from a source of analog video; sampling the analog video using one or more analog to digital converters at a sample clock rate with the next phase; generating digital video from the sampled analog video; and determining a quality measure based on statistics of pixel to pixel differences in a coordinate of the generated digital video that have magnitude exceeding a pre-determined threshold. Initially, the next phase is a first phase.

Particular embodiments include an apparatus comprising: a receiver configured to accept analog video from a source of analog video and to output digital video. The source of analog video includes one or more digital to analog converters and is configured to output the analog video and a horizontal synchronization indication. The receiver is configured to sample the analog video using one or more analog to digital converters at a sample clock rate and sample clock phase. The apparatus further comprises a color space converter configured to convert output values of the one or more analog to digital converters to coordinates that include an intensity coordinate of an intensity measure. In addition, the apparatus comprises a clock signal generator coupled to the video rate analyzer configured to accept an indication of the number of samples in a video line and a phase signal and generate a sample clock signal at the sample clock rate and sample clock phase for the one or more analog to digital converters, and a phase calculating processor. The phase calculating processor is configured to: accept the horizontal synchronization indication and to determine an indication of the number of samples in a video line; repeat for a plurality of different phase settings determining for a frame a respective sampling quality measure, and select a phase to use based on the determined quality measures for the plurality of phase settings. The determining of the sampling quality measure includes: setting the phase of a sampling clock to a next phase of the different phase settings, wherein initially, the next phase is a first phase; accepting analog video and a horizontal synchronization indication from a source of analog video; sampling the analog video at the sample clock rate with the next phase; and determining a quality measure based on statistics of pixel to pixel differences sampled intensity coordinate values that have magnitude exceeding a pre-determined threshold. The apparatus further includes a video encoder coupled to the color space converter configured to accept digital video in the coordinates and to encode the digital video for transmission to one or more remote terminals.

Particular embodiments may provide all, some, or none of these aspects, features, or advantages. Particular embodiments may provide one or more other aspects, features, or advantages, one or more of which may be readily apparent to a person skilled in the art from the figures, descriptions, and claims herein.

Some Embodiments

FIG. 1 shows an apparatus embodiment 100 of the invention that includes a video receiver 111 configured to accept analog video, in this embodiment in the form of analog RGB inputs, from a source 103 of analog video and to output digital video. In the embodiment shown, the source of analog video 103 is a computer display controller in a desktop computer, e.g., a VGA controller 103 that includes one or more digital to analog converters 107, memory 105 storing RGB values, and control circuitry 109, and configured to output the analog RGB video and a horizontal synchronization (HSYNC) indication. As is common in the art, the analog video output from the source 103 includes a vertical synchronization (VSYNC) indication. As an example, the computer display device 103 may be supplying the display while several application programs are running and displaying one or more display windows, so that the display output may include text, icons, several windows, including one or more windows with motion video running in it.

The receiver 111 includes one or more analog to digital converters (ADCs) 113 and configured to sample the analog video using the ADCs at a sample clock rate and sample clock phase using sample clock signal provided by a clock signal generator 121 that in one embodiment includes a phase locked loop (PLL) 119.

The receiver 111 is configured to output digital video as well a pixel clock output CLK, horizontal synchronization information HSOUT and vertical synchronization information VSOUT for the digital video.

One embodiment includes a video rate analyzer 123 configured to accept at least the HSYNC indication and to determine an indication of the number of samples in a video line. Denote by N the number of video samples between successive HSYNC pulses. In one embodiment, the video rate analyzer determines the value of N. If the PLL is synchronized to HSYNC pulses, then N is a divider for the PLL that determines the sample clock for sampling the input video. For one 1024×768 video embodiment, N=1344 samples, including the non-visible samples.

In one embodiment, the format of the signals from the source 103 are as prescribed by the Video Electronics Standards Association (VESA) standard (see www_dot_VESA-_dot_org) to fall into one of a plurality of pre-defined screen resolutions and frame rates, e.g., 60 frames per second of 1024 by 768 video. The frequency and other information, e.g., possible polarity of the HSYNC and VSYNC signals also are prescribed by the VESA standard. Note that the invention is not limited to working with VESA standard signals, and in one embodiment, information on other possible video formats is programmable. In one embodiment, the video rate analyzer 123 is configured to examine the frequency and polarity of the VSYNC and HSYNC signals and information on video, e.g., based on the VESA standard and other allowed formats, and to determine N. In one embodiment, N itself is directly programmable.

The clock signal generator 121 is coupled to the video rate analyzer and configured to accept an indication of the number of samples in a video line, e.g., N, and a phase signal and generate a sample clock signal at the sample clock rate and sample clock phase for the one or more ADCs.

One feature of the invention is an apparatus that is configured to set the sampling phase of the sampling clock signal correctly such that the waveforms are sampled at correct times. The VESA standard, for example, does not specify at what phase to sample, and thus, the same receiver might need to sample at different phase values for outputs from display controls from different PC manufacturers. Without proper phase adjustment, the sampling can occur on signal transitions when there are hard edges in the video, which is common.

Figure 5:
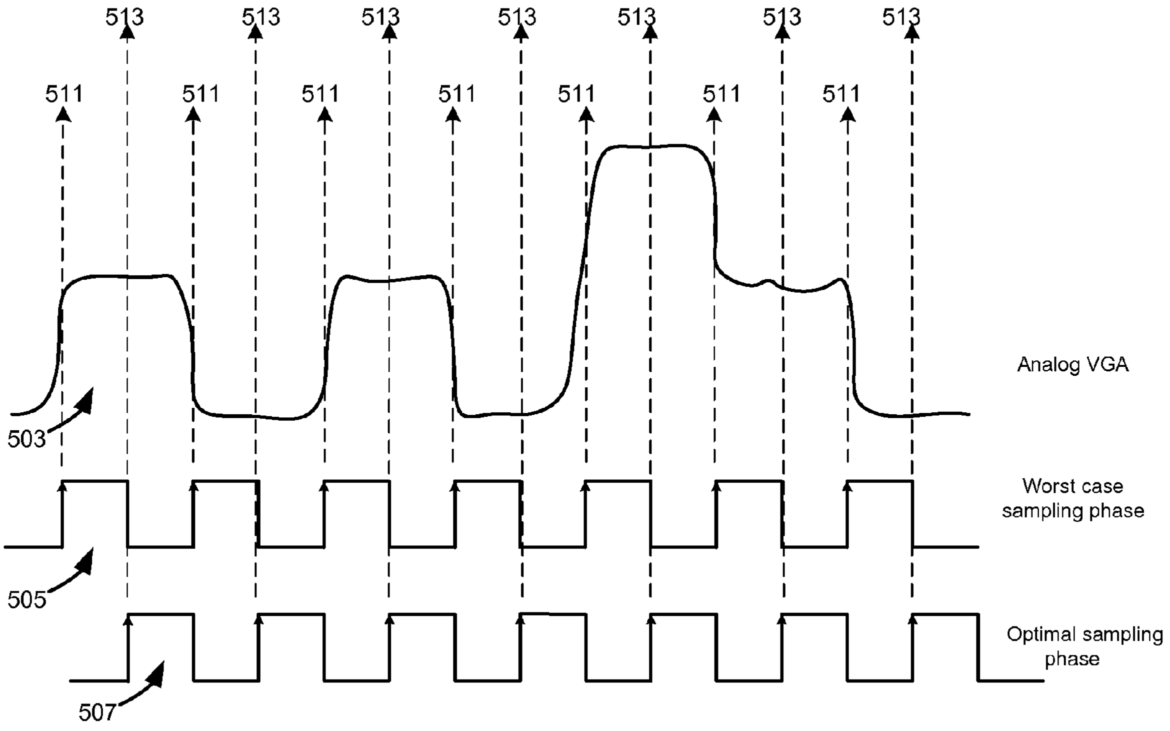
FIG. 5 shows an example waveform of a video signal and two possible sampling phases for sampling the waveform.

FIG. 5 shows an example waveform 503 of a video signal that ideally has staircase-like shape as a result of conversion by the DACs 107 of the display controller 103 providing the analog video. A first clock signal waveform 505 having the correct sampling rate but an undesirable sampling phase is shown. Assuming sampling is at the rising edges of the clock waveform, indicated by broken lines 511, it is clear that sampling according to waveform 505 may lead to artifacts in the resulting digital output. A second clock signal waveform 507 also having the correct sampling rate but in this case a desirable sampling phase is shown. The sampling phase is 180 degrees from the sampling phase of waveform 505, leading to sampling points indicated by the broken lines 513.

Referring back to FIG. 1, one embodiment of the invention includes a phase adjuster 125 configured to receive the digital video output from the receiver 111 and to determine the phase for the clock signal generator 121.

In one embodiment, the phase adjuster 125 is configured to compare statistics of pixel to pixel differences that have magnitude exceeding a pre-determined threshold for different sample clock phases to determine the phase for the clock signal generator.

Figure 6:
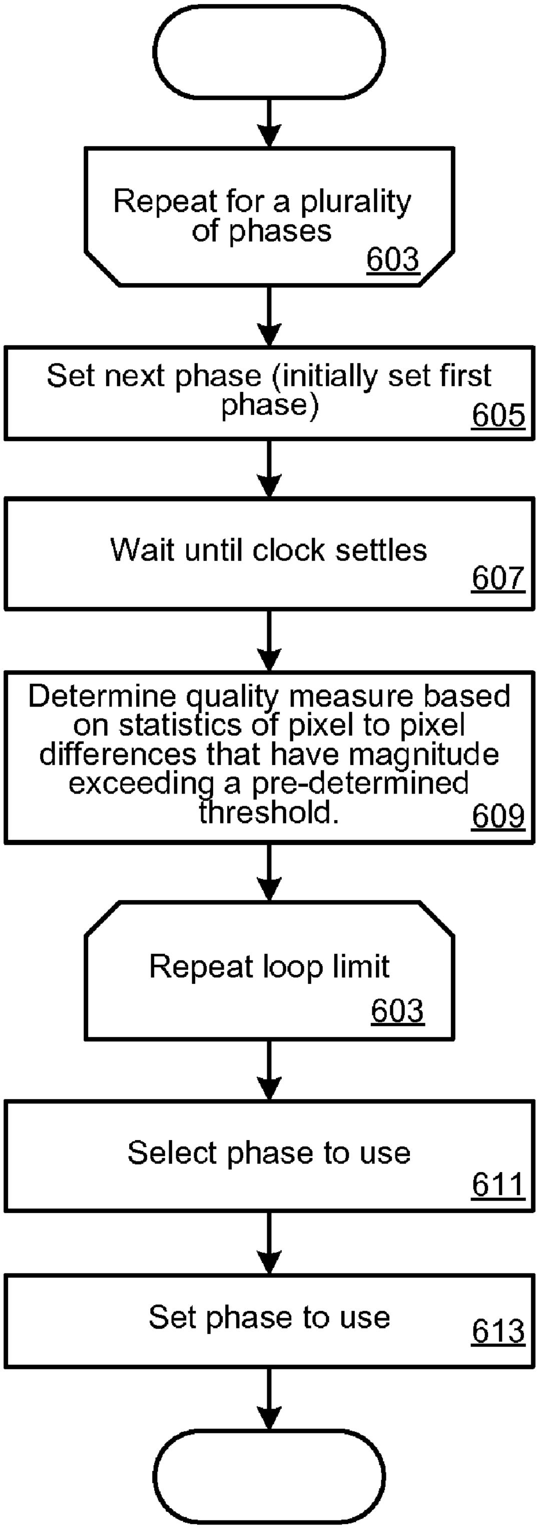
FIG. 6 shows a flow chart of one method embodiment of the invention carried out by an apparatus such as that shown in FIG. 1.

FIG. 6 shows a flow chart of one method embodiment of the invention carried out, e.g., by an apparatus 100 such as that shown in FIG. 1. The method includes repeating (603) for a plurality of different phase settings steps for determining a respective sampling quality measures. Such determining of a sampling quality measure includes in 605, setting the phase of a sampling clock, e.g., from clock generator 121, to a next phase of the different phase settings. The next phase is initially set to a first phase. Analog video and a HSYNC indication are accepted from a source of analog video, e.g., VGA controller 103, and the clock is used with ADCs to sample the accepted analog video at a sample clock rate with the next phase to generate digital video from the sampled analog video. Step 609 includes determining a quality measure based on statistics of pixel to pixel differences in the generated digital video that have magnitude exceeding a pre-determined threshold. The method includes in 611 selecting a phase to use based on the determined quality measures for the plurality of phase settings; and in 613 setting the phase at the selected phase.

When a new phase value is set for the clock generator 121, it typically would take some (relatively small amount of) time for the PLL 119 to settle. In one embodiment, for each next phase of the phase settings, the generated digital video for the calculating of the quality measure is after waiting a relatively small time after the setting of the phase of the sampling clock. In one embodiment, the amount of time is 10 frames, i.e., ⅙ s for 60 Hz frame rate video. In one embodiment, the waiting time is settable.

Note that while one embodiment includes sampling the analog video at a clock rate that is equal to the pixel clock rate, i.e., one sample per pixel position, in alternate embodiments, for the determining of the phase to use in the repetition 603, the analog input video is sampled at any multiple of the pixel clock rate.

Figure 2A:
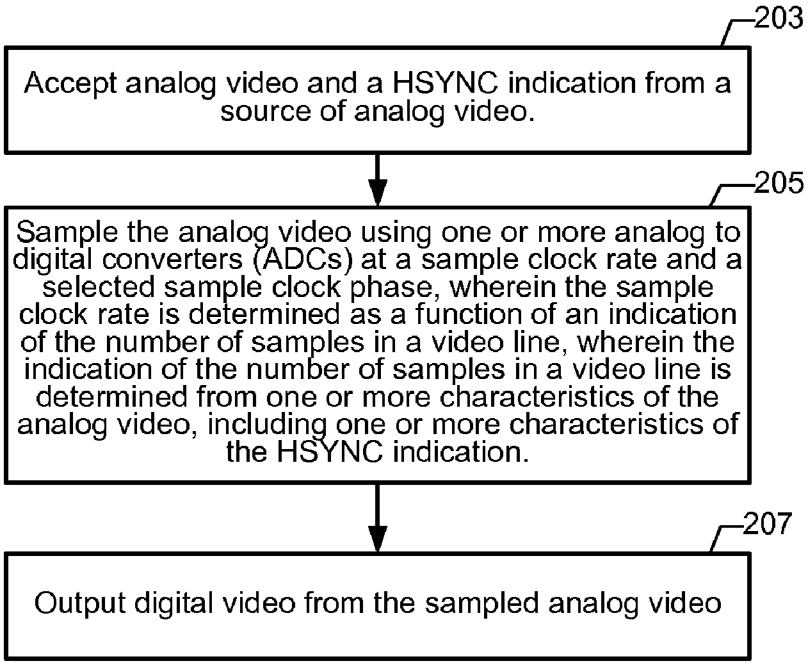
FIG. 2A shows a flow chart of a method embodiment of the invention as implemented by an apparatus such as included in the apparatus shown in FIG. 1.
Figure 2B:
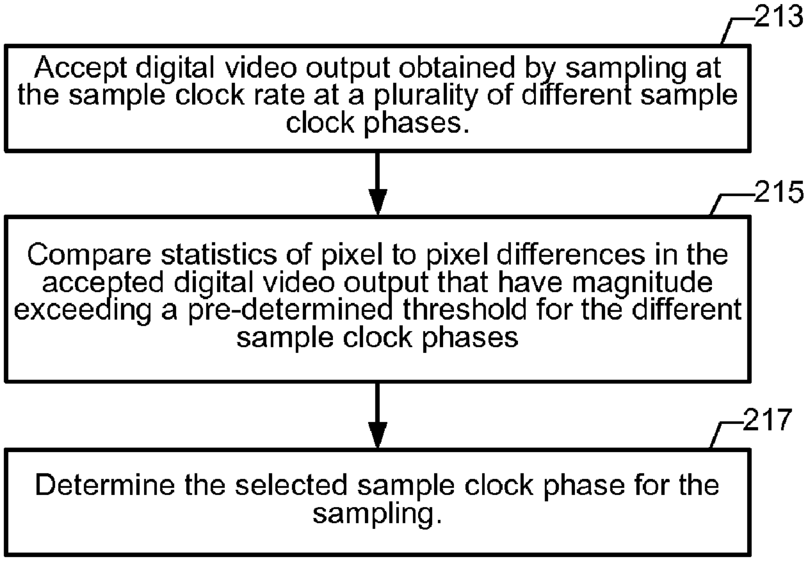
FIG. 2B shows a flow chart of a method for determining the selected sample clock phase applicable to the flow chart shown in FIG. 2A.

FIG. 2A shows another flow chart of a method embodiment of the invention, e.g., as implemented by an apparatus such as included in the apparatus shown in FIG. 1. The method comprises in 203, accepting analog video and a horizontal synchronization (HSYNC) indication from a source of analog video, in 205 sampling the analog video using one or more ADCs at a sample clock rate and a selected sample clock phase. The sample clock rate is determined as a function of an indication of the number of samples in a video line, e.g., of N. The indication of the number of samples in a video line is determined from one or more characteristics of the analog video, including one or more characteristics of the HSYNC indication. The method includes in 207 outputting digital video from the sampled analog video. In one embodiment, the selected sample clock phase is determined using a process shown in the flow chart of FIG. 2B and includes in 213 accepting digital video output obtained by sampling at the sample clock rate with a plurality of different sample clock phases, and in 205 comparing statistics of pixel to pixel differences in the accepted digital video output that have magnitude exceeding a pre-determined threshold for the different sample clock phases to determine in 217 the selected sample clock phase for the sampling.

Referring again to FIG. 1, the analog video from the source 103 of analog video includes R, G, and B signals. The receiver is configured to sample R, G, and B values. One embodiment includes a color space converter accepting sampled RGB values and configured to convert the R, G, and B values to coordinates that include an intensity coordinate of an intensity measure. Common examples of such intensity measures are a luminance denoted Y and luma denoted Y'. Examples of such coordinates include YUV and Y'CrCb. One embodiment of the invention includes converting to YUV, another to Y'CrCb. For simplicity, in the drawings, YUV refers to any such color space. In one embodiment, the coordinate conversion is programmable, e.g., by entering a coordinate transformation matrix. The phase adjuster 125 is configured to receive the intensity coordinate values and to determine the phase from the intensity coordinate samples.

In one embodiment, each quality measure for each next phase of the phase settings is calculated for a frame of the input video. While one embodiment uses a complete frame, in another embodiment, the quality measure is obtained for part of a frame. In one such embodiment, the statistics for the quality measure include a count of the number of pixel to pixel differences in the Y (or Y') coordinate that have magnitude exceeding the pre-determined threshold within the whole or part of the frame, that is. Thus, the quality measure is determined within a rectangular window within a frame of the converted digital video, such a window possibly being the whole frame. In one embodiment, the location and size of the window is settable as a programmable parameter. In one embodiment, the window includes substantially the whole visible frame except for the first and last 8 pixels in each line.

While the invention is not limited to using any particular pre-selected threshold, the inventors have found that a threshold that is a function of the dynamic range of the luma coordinate works well, and discovered that a threshold of about ¼ of the dynamic range of the video information gives good results for typical desktop computer images where large differences can be expected due to the presence of text and of windows having relatively sharp edges.

Thus, in one embodiment, the pre-selected threshold is a pre-selected portion of the maximum possible pixel-to-pixel difference magnitude—the dynamic range, e.g., of the luma coordinate. In one embodiment, the pre-selected threshold is selected to be ¼ of the dynamic range. Of course other values are possible, and in one embodiment, the threshold is settable, e.g., by setting the portion of the dynamic range, or in an alternate implementation, by setting an amount.

The selecting of step 611 in one embodiment selects the phase that gives the maximum count of the number of pixel to pixel differences in the Y (or Y') coordinate that have magnitude exceeding the pre-determined threshold.

In an alternate embodiment, the selecting of step 611 in one embodiment finds the phase that gives the minimum count of the number of pixel to pixel differences in the Y (or Y') coordinate that have magnitude exceeding the pre-determined threshold, and selects as the phase to use the phase that is 180 degrees from the phase that minimizes the count.

One embodiment of the invention is a video teleconferencing terminal apparatus that is configured to accept the analog video from a source such as source 103, to resample the analog video to generate digital video using a clock at a sampling rate determined by characteristics of the analog video and at a sampling phase determined by the sampling phase determining method/phase adjuster. The terminal is configured to convert the video to a form suitable for compression, e.g., to YUV or to Y'CrCb, and to send the compressed video to a remote terminal, e.g., via a network. The phase determining uses a quality measure based on statistics of pixel to pixel differences in the generated digital video that have a magnitude exceeding a pre-determined threshold.

Figure 3:
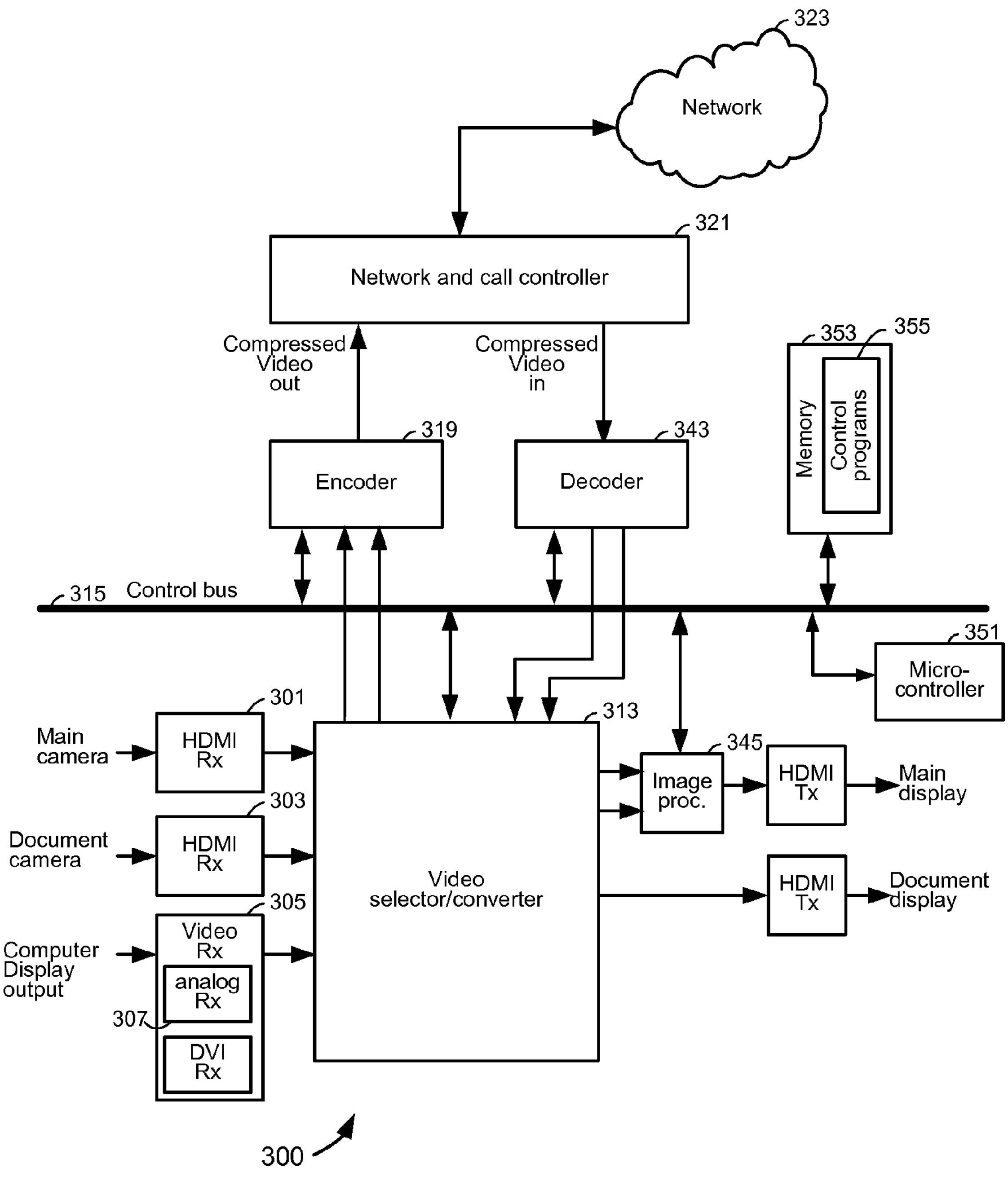
FIG. 3 shows a simple block diagram an apparatus that includes an embodiment of the present invention and that is used for video processing in a terminal of a videoconferencing system.

FIG. 3 shows a simple block diagram of such an apparatus 300 that includes an embodiment of the present invention and that is used for video processing in a terminal of a videoconferencing system in which compressed video is sent and received to and from one or more other terminals or conferencing controllers via a network 323, e.g., the Internet, and in which locally generated video is accepted. A display part displays the video corresponding to signals received via the network 323 and signals generated locally, e.g., from one or more cameras and from a computer. One feature of the invention is related to resampling analog video generated by the computer. The invention, however, is not limited to such contexts and applications.

In the apparatus 300 of FIG. 3, a main camera, optionally a document camera, and optionally a computer are used. The resampling typically but not necessarily is of the video generated from a computer, that is, is a computer display output. Thus, assume the computer is used. The main camera and document camera are coupled to respective HDMI (High Definition Multimedia Interface) receivers for the main and document cameras, and a video receiver 305 that in one embodiment includes an analog video receiver 307, and in another embodiment further includes both an analog video receiver 307, and a DVI (Digital Video Interface) receiver for the computer source. The respective HDMI or DVI receivers are configured to convert the HDMI or DVI serial bit streams to parallel video signals. The analog video receiver is configured to convert analog RGB signals to 24 bits of RGB data, including sampling the video signal to produce digital samples, and also to produce a horizontal sync (HSYNC) and vertical sync (VSYMC) signals, as well as a pixel clock indicative of the sampling times for the RBG signals.

A video selector/converter unit 313, in one embodiment in the form of a field programmable gate array device (an FPGA), is configured both to direct various video signals to and from elements of the apparatus, and to carry out color coordinate conversion, e.g., from RGB to YUV for the computer display output via the video receiver 305. One embodiment also includes a multiplexer (not separately shown). The video selector/converter 313 is coupled to a control bus 315 and controlled from a microcontroller 351 that is coupled to the control bus. A memory 353 is shown containing software 355 (shown as “Control programs”) that is configured when executed by the microcontroller 351, together with the hardware, to control operation of the system. Note that in some embodiments, some of the software 355 may be in a built-in memory in the microcontroller. Furthermore, in some embodiments, a processing system containing one processor or more than one processor may replace the microcontroller.

One feature of the invention includes instructions as part of the programs 355 to direct the microcontroller to accept an HSYNC and VSYNC indications and sampled Y (or Y') values of the sampled YUV (or Y'CrCb) that results by converting, in the video selector/converter, sampled RGB from the analog video receiver 307 of the video receiver 305, and to determine an indication of the number of samples per video line for use by the analog video receiver 307, and further to determine a phase adjustment for the analog video receiver 307 for sampling the analog computer display output. In one embodiment, the sampled Y (or Y') values for a window within a frame—possibly the whole frame—are read into memory 353, and a quality measure based on statistics of pixel to pixel differences in the digital video Y (or Y') values that have magnitude exceeding a pre-determined threshold determined. This is repeated for a set of different phase settings by setting the sampling phase of the analog video receiver 307, waiting a predetermined amount of time for the clock circuits, e.g., a PLL in the analog video receiver 307 to settle, and determining the quality measure, as described above. In one embodiment, the quality measure is a measure of the count of the number of pixel to pixel differences in the Y (or Y') coordinate that have magnitude exceeding the pre-determined threshold within a window of the frame, which might be the whole frame, and in one embodiment is smaller than the whole frame to avoid areas near the frame boundary. For the video conferencing application, the inventors chose to select a window away from the frame boundary as this is where the image is likely to have noise or filtering artifacts, and thus give a more discriminating quality measure. One embodiment selects the phase that maximizes this count measure, while an alternate embodiment selected the phase that is approximately 180 degrees out of phase with the phase that minimizes this count measure.

Note that in order not to obscure details, various segments of the control bus 315 are shown separately, and furthermore, the bus is shown as a single bus. Those in the art will understand that modern bus subsystems are more complex.

The three video inputs are in one embodiment, directed to a high definition video 319 encoder to encode the video signals to produce compressed video data to be sent via a network and call controller 321 coupled to the network 323. A decoder 343 coupled to the network 323 via the network and call controller 321 is configured to decode compressed video data, e.g., that arrives from the computer network 232 and transfers two streams of video data to the video selector/converter 313. The video 319 encoder and the video decoder are each coupled to the control bus 315 and controlled by the microcontroller 351 that is coupled to the control bus.

In one embodiment, the encoded video is according to the ITU-T H.264/AVC standard.

In addition to the two streams from the decoder board 343, the video selector/converter 313 also accepts an input stream from the local main camera via the first HDMI receiver 301 for output to local displays. The video selector/converter 313 selects two of the three inputs, e.g., the decoded main camera output from the first HDMI receiver 301 and the computer output from the video receiver 305, and transfers them to an image processing unit 345 that is configured in conjunction with the selector 313 to process the two input streams and combine them with an on-screen display and perform functions such as one or more of rate conversions, picture-in-picture (PIP), picture-on-picture (POP), picture-by-picture (PBP) and on-screen-display (OSD) for a local display. The output of the image processing unit 345 is forwarded to a local display, via an HDMI transmitter in one embodiment. The decoder 343 in one version also supplies a second video output which is that of either a decoded document camera or a computer source video.

Thus, in one embodiment, the computer display output accepted by the analog receiver 307 of the video receiver 305 is in RGB. The apparatus includes (as part of the video selector/converter 313) a video space converter to convert from RGB coordinates to a coordinate system that uses an intensity coordinate, e.g., a luminance or luma signal. In one embodiment, the RGB is converted to YUV.

To not distract from the main inventive aspects, not shown are various elements such as a memory for the image processor 345, a video input clock, and so forth.

Figure 4:
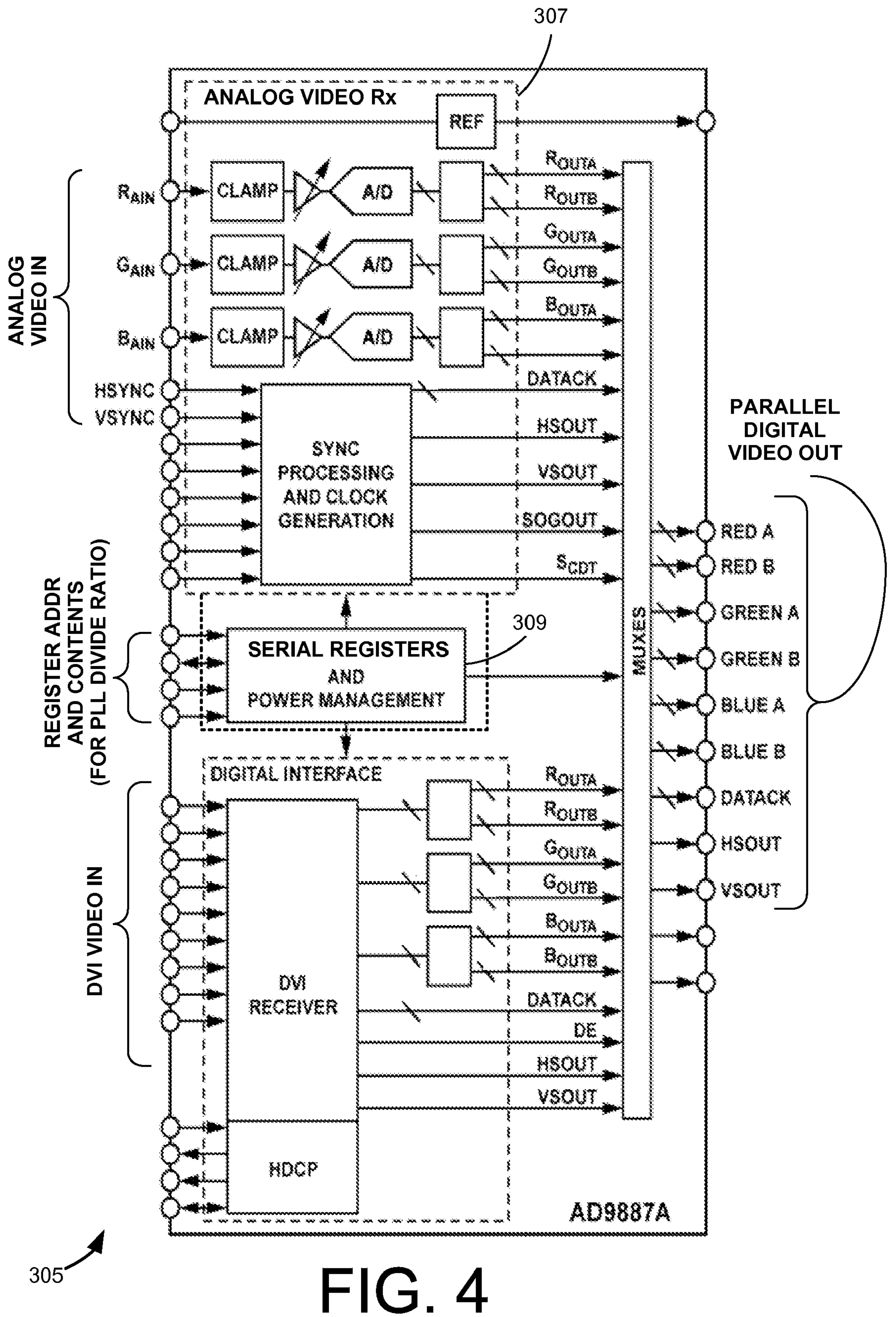
FIG. 4 shows a simplified block diagram of a commercially available video receiver used in an implementation of the present invention.

In one embodiment, the video receiver 305 uses an Analog Devices AD9887A receiver made by Analog Devices, Inc., Norwood, Mass., in the video receiver 305. FIG. 4 shows a simplified block diagram of the Analog Devices AD9887A.

The analog receiver portion 307 of the video receiver 305 accepts one of 32 possible phase settings. In one embodiment, referring again to the flow chart of FIG. 6 and the above description thereof, the set of possible phase settings includes all 32 settings. If the pre-selected waiting time of 10 frames is used, then this means it would take 320 frames—over 5 seconds—to determine the phase. In one embodiment, the inventors chose to skip every second possible phase setting for the Analog Devices AD9887A, such that only 16 settings are used. Note that in FIG. 4, the analog receiver 305 includes a portion of the serial registers section 309 because the phase and number of samples between HSYNC pulses is entered in the component by setting register values.

The inventors have found that for typical desktop computer video output, e.g., running at a screen resolution of 1024×768 at 60 Hz on Microsoft Windows and having various applications running on the screen, including icons, windows open running applications such as word processing applications, possibly one or more windows with motion video running in each, the methods described herein provide good results. Our intuition is that nice crisp large edges will tend to go under the pre-selected threshold, e.g., about ¼ of the dynamic range in the Y or Y' coordinate when the sampling phase is wrong. It turns out that when we sample according to the methods described herein versus the worst case, there can be a 5:1 difference in the number of transitions that exceed such a pre-selected threshold. One might expect that for resampling to work well would depend on the input remaining static in order for the inventive methods to work, but since the difference in the number of transitions that exceed the pre-selected threshold is so great, we have found that the methods described herein work well even when the input changes, as in motion video. It appears that sampling error tends to change the number of transitions more than changes in the picture input signal. This, coupled with the described method that checks phase decision with successive repetitions, provides us with confidence that the methods described herein should work well without needing static input.

Furthermore, because the methods described herein rely on the absolute values of differences that exceed a threshold rather than on maximum absolute difference computed over a frame, the method seems to be more robust in the presence of noise, imperfect reconstruction filtering, and sampling jitter than methods that rely on absolute difference computed over a frame. Furthermore, the method described herein supports any sampling frequency that is an integral multiple of the source clock frequency.

In an alternate embodiment, the repetition loop 603 of the flow chart of FIG. 6—the testing cycle—can be performed multiple times to determine histograms, and the resulting histograms compared to attain even better results. The inventors found, however, that if the settling time of the PLL is long, multiple passes will tend to result in a degraded user experience).

In one embodiment, a computer-readable medium is encoded with computer-implemented instructions that when executed by one or more processors of a processing system, e.g., in a video conferencing terminal such as shown in FIG. 3, cause the one or more encoding subsystem to carry out any of the methods described herein.

One embodiment is in the form of logic encoded in one or more computer-readable media for execution and when executed operable to carry out any of the methods describe herein. One embodiment is in the form of software encoded in one or more computer-readable media and when executed operable to carry out any of the methods described herein.

It should be appreciated that although embodiments of the invention have been described in the context of alternative embodiments of the present invention are not limited to such contexts and may be used in various other applications and systems, whether conforming to a video standard, or especially designed. For example, the embodiments described herein describe that the analog video output conforms to one of the VESA standards. The invention is not limited to any particular analog video format. Similarly, while embodiments of the invention include converting the resampled video to Y'CrCb or to YUV and using only the Y or Y' information to determine the phase adjustment for resampling, the invention is not so limited to YUV or to Y'CrCb, but can operate in any color space, or with monochrome video. Furthermore, the invention can be implemented using any type of video information, e.g., one or more, or a combination of one or more of the color channels, e.g., of R, G and B in the case of RGB video.

Furthermore, embodiments of the invention described herein use a commercially available integrated circuit that includes a video resampler. The invention is however not limited to using such a part, and can be implemented in a specially designed circuit, even a discrete circuit in which the ADCs are discrete components, and that includes circuit elements or process steps for implementing the different embodiments of the invention.

While embodiments described herein include a video rate analyzer or analysis step that determines the number of samples in a video line, the invention is not limited to actually determining the number of samples in a video line, but rather any indication of the number of samples in a video line, that is, any quantity that is directly dependent on that number.

Furthermore, embodiments are not limited to any one type of architecture or protocol, and thus, may be used in conjunction with one or a combination of other architectures/protocols.

Unless specifically stated otherwise, as apparent from the following discussions, it is appreciated that throughout the specification discussions using terms such as "processing," "computing," "calculating," "determining" or the like, refer to the action and/or processes of a computer or computing system, or similar electronic computing device, that manipulate and/or transform data represented as physical, such as electronic, quantities into other data similarly represented as physical quantities.

In a similar manner, the term "processor" may refer to any device or portion of a device that processes electronic data, e.g., from registers and/or memory to transform that electronic data into other electronic data that, e.g., may be stored in registers and/or memory. A "computer" or a "computing machine" or a "computing platform" may include one or more processors.

Note that when a method is described that includes several elements, e.g., several steps, no ordering of such elements, e.g., steps, is implied, unless specifically stated.

The methodologies described herein are, in one embodiment, performable by one or more processors that accept computer-readable (also called machine-readable) logic encoded on one or more computer-readable tangible media in which are encoded a set of instructions that when executed by one or more of the processors carry out at least one of the methods described herein. Any processor capable of executing a set of instructions (sequential or otherwise) that specify actions to be taken are included. Thus, one example is a typical processing system that includes one or more processors. Each processor may include one or more of a CPU, a graphics processing unit, and a programmable DSP unit. The processing system further may include a memory subsystem including main RAM and/or a static RAM, and/or ROM. A bus subsystem may be included for communicating between the portions. The processing system further may be a distributed processing system with processors coupled by a network. If the processing system requires a display, such a display may be included, e.g., a liquid crystal display (LCD) or a cathode ray tube (CRT) display. If manual data entry is required, the processing system also includes an input device such as one or more of an alphanumeric input unit such as a keyboard, a pointing control device such as a mouse, and so forth. The term memory unit as used herein, is clear from the context and unless explicitly stated otherwise, also encompasses a storage system such as a disk drive unit. The processing system in some configurations may include a sound output device, and a network interface device. The memory subsystem thus includes a computer-readable medium that carries logic (e.g., software) including a set of instructions to cause performing, when executed by one or more processors, one of more of the methods described herein. The software may reside in the hard disk, or may also reside, completely or at least partially, within the RAM and/or within the processor during execution thereof by the computer system. Thus, the memory and the processor also constitute computer-readable medium on which is encoded logic, e.g., in the form of instructions.

Furthermore, a computer-readable medium may form, or be included in a computer program product.

In alternative embodiments, the one or more processors operate as a standalone device or may be connected, e.g., networked to other processor(s), in a networked deployment, the one or more processors may operate in the capacity of a server or a client machine in server-client network environment, or as a peer machine in a peer-to-peer or distributed network environment. The one or more processors may form a personal computer (PC), a tablet PC, a set-top box (STB), a Personal Digital Assistant (PDA), a cellular telephone, a web appliance, a network router, switch or bridge, or any machine capable of executing a set of instructions (sequential or otherwise) that specify actions to be taken by that machine.

Note that while some diagram(s) only show(s) a single processor and a single memory that carries the logic including instructions, those in the art will understand that many of the portions described above are included, but not explicitly shown or described in order not to obscure the inventive aspect. For example, while only a single machine is illustrated, the term "machine" shall also be taken to include any collection of machines that individually or jointly execute a set (or multiple sets) of instructions to perform any one or more of the methodologies discussed herein.

Thus, one embodiment of each of the methods described herein is in the form of a computer readable medium in which are encoded a set of instructions, e.g., a computer program that are for execution on one or more processors, e.g., one or more processors that are part of an encoding system. Thus, as will be appreciated by those skilled in the art, embodiments of the present invention may be embodied as a method, an apparatus such as a special purpose apparatus, an apparatus such as a data processing system, or a medium, e.g., a computer program product. The computer-readable medium carries logic including a set of instructions that when executed on one or more processors cause the apparatus that includes the processor or processors to implement a method. Accordingly, aspects of the present invention may take the form of a method, an entirely hardware embodiment, an entirely software embodiment or an embodiment combining software and hardware aspects. Furthermore, the present invention may take the form of computer readable medium (e.g., a computer program product on a computer-readable storage medium) carrying computer-readable program code embodied in the computer readable.

While a computer readable is shown in an example embodiment to be a single computer readable, the term "computer readable" should be taken to include a single computer readable or multiple media (e.g., a centralized or distributed database, and/or associated caches and servers) that store the one or more sets of instructions. The term "computer readable" shall also be taken to include any medium that is capable of storing, encoding a set of instructions for execution by one or more of the processors and that cause the one or more processors to perform any one or more of the methodologies of the present invention. A computer readable may take many forms, including tangible storage media. Non-volatile media includes, for example, optical, magnetic disks, and magneto-optical disks. Volatile media includes dynamic memory, such as main memory. Transmission media includes coaxial cables, copper wire and fiber optics, including the wires that comprise a bus subsystem. For example, the term "computer readable" shall accordingly be taken to included, but not be limited to, solid-state memories, a computer product embodied in optical and magnetic media.

It will be understood that the steps of methods discussed are performed in one embodiment by an appropriate processor (or processors) of a processing (i.e., computer) system executing instructions stored in storage. It will also be understood that the invention is not limited to any particular implementation or programming technique and that the invention may be implemented using any appropriate techniques for implementing the functionality described herein. The invention is not limited to any particular programming language or operating system.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" or "in some embodiments" or similar phases in various places throughout this specification are not necessarily all referring to the same embodiment(s), but may be doing so, as would be clear to one of ordinary skill in the art. Furthermore, the particular features, structures or characteristics may be combined in any suitable manner, as would be apparent to one of ordinary skill in the art from this disclosure, in one or more embodiments.

Similarly it should be appreciated that in the above description of example embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the Detailed Description are hereby expressly incorporated into this Detailed Description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out the invention.

In the description provided herein, numerous specific details are set forth. However, it is understood that embodiments of the invention may be practiced without these specific details. In other instances, well-known methods, structures and techniques have not been shown in detail in order not to obscure an understanding of this description.

As used herein, unless otherwise specified the use of the ordinal adjectives "first", "second", "third", etc., to describe a common object, merely indicate that different instances of like objects are being referred to, and are not intended to imply that the objects so described must be in a given sequence, either temporally, spatially, in ranking, or in any other manner.

It should further be appreciated that although the invention has been described in the context of H.264/AVC, the invention is not limited to such contexts and may be used in various other applications and systems, for example in a system that uses MPEG-2 or other compressed media streams, whether conforming to a published standard or not Furthermore, the invention is not limited to any one type of network architecture and method of encapsulation, and thus may be used in conjunction with one or a combination of other network architectures/protocols.

All publications, patents, and patent applications cited herein are hereby incorporated by reference.

Any discussion of prior art in this specification should in no way be considered an admission that such prior art is widely known, is publicly known, or forms part of the general knowledge in the field.

In the claims below and the description herein, any one of the terms comprising, comprised of or which comprises is an open term that means including at least the elements/features that follow, but not excluding others. Thus, the term comprising, when used in the claims, should not be interpreted as being limitative to the means or elements or steps listed thereafter. For example, the scope of the expression a device comprising A and B should not be limited to devices consisting only of elements A and B. Any one of the terms including or which includes or that includes as used herein is also an open term that also means including at least the elements/features that follow the term, but not excluding others. Thus, including is synonymous with and means comprising.

Similarly, it is to be noticed that the term coupled, when used in the claims, should not be interpreted as being limitative to direct connections only. The terms "coupled" and "connected," along with their derivatives, may be used. It should be understood that these terms are not intended as synonyms for each other. Thus, the scope of the expression a device A coupled to a device B should not be limited to devices or systems wherein an output of device A is directly connected to an input of device B. It means that there exists a path between an output of A and an input of B which may be a path including other devices or means. "Coupled" may mean that two or more elements are either in direct physical or electrical contact, or that two or more elements are not in direct contact with each other but yet still co-operate or interact with each other.

Thus, while there has been described what are believed to be the preferred embodiments of the invention, those skilled in the art will recognize that other and further modifications may be made thereto without departing from the spirit of the invention, and it is intended to claim all such changes and modifications as fall within the scope of the invention. For example, any formulas given above are merely representative of procedures that may be used. Functionality may be added or deleted from the block diagrams and operations may be interchanged among functional blocks. Steps may be added or deleted to methods described within the scope of the present invention.

We claim:

1. An apparatus comprising:

a receiver configured to accept analog video from a source of analog video and to output digital video, the source of analog video including one or more digital to analog converters and configured to output the analog video and a horizontal synchronization indication, the receiver configured to sample the analog video using one or more analog to digital converters at a sample clock rate and sample clock phase;

a clock signal generator coupled to the video rate analyzer configured to accept an indication of the number of samples in a video line and a phase signal and generate a sample clock signal at the sample clock rate and sample clock phase for the one or more analog to digital converters; and a phase adjuster configured to receive the digital video output from the receiver and to determine the phase signal for the clock signal generator, wherein the phase adjuster is configured to compare statistics of pixel to pixel differences that have magnitude exceeding a pre-determined threshold for a plurality of different sample clock phases to determine the phase for phase signal for the clock signal generator.

2. The apparatus of claim 1, wherein the analog video includes R, G, and B signals, such that the receiver is configured to sample R, G, and B values, the apparatus further comprising a color space converter configured to convert the R, G, and B values to coordinates that include an intensity coordinate of an intensity measure, and wherein the phase adjuster is configured to accept the intensity coordinate values and to determine the phase from the intensity coordinate samples.

3. The apparatus of claim 2, wherein the phase adjuster is configured to:

repeat for a plurality of phase settings: setting the phase, waiting a pre-determined time interval, accepting the intensity coordinate values for at least part of a frame; and determining the statistics from the accepted intensity coordinate values; and select the phase to use, in order to compare the statistics to determine the phase signal.

4. The apparatus of claim 1, wherein the statistics include for a frame of the digital video a count of the number of pixel to pixel differences that have magnitude exceeding the pre-determined threshold within the whole or part of the frame, and wherein the phase adjuster is configured to select the phase that maximizes the count.

5. The apparatus of claim 1, wherein the statistics include for a frame of the digital video a count of the number of pixel to pixel differences that have magnitude exceeding the pre-determined threshold within the whole or part of the frame, and wherein the phase adjuster is configured to select the phase that is 180 degrees from the phase that minimizes the count.

6. The apparatus of claim 1, wherein the pre-selected threshold is a pre-selected portion of the maximum possible pixel-to-pixel difference magnitude.

7. The apparatus of claim 6, wherein the receiver is configured to output the video in a coordinate system that includes an intensity coordinate, wherein the phase adjuster is configured to receive intensity coordinate sample values and to determine the phase from the intensity coordinate sample values, and wherein the pre-selected threshold is about ¼ of the maximum possible pixel-to-pixel difference magnitude of the intensity coordinate.

8. A method comprising:

accepting analog video and a horizontal synchronization indication from a source of analog video;

sampling the analog video using one or more analog to digital converters at a sample clock rate and a selected sample clock phase, wherein the sample clock rate is determined as a function of an indication of the number of samples in a video line, wherein the indication of the number of samples in a video line is determined from one or more characteristics of the analog video, including one or more characteristics of the horizontal synchronization indication; and outputting digital video from the sampled analog video, wherein the selected sample clock phase is determined using a process that includes accepting digital video output obtained by sampling at the sample clock rate with a plurality of different sample clock phases and comparing statistics of pixel to pixel differences in a coordinate of the accepted digital video output that have magnitude exceeding a predetermined threshold for the different sample clock phases to determine the selected sample clock phase for the sampling.

9. A method comprising:

repeating for a plurality of different phase settings determining a respective sampling quality measure;

selecting a phase to use based on the determined quality measures for the plurality of phase settings; and setting the phase at the selected phase, wherein the determining of the sampling quality measure includes:

setting the phase of a sampling clock to a next phase of the different phase settings, wherein initially, the next phase is a first phase;

accepting analog video from a source of analog video;

sampling the analog video using one or more analog to digital converters at a sample clock rate with the next phase; and generating digital video from the sampled analog video; and determining a quality measure based on statistics of pixel to pixel differences in a coordinate of the generated digital video that have magnitude exceeding a pre-determined threshold.

10. The method of claim 9, wherein for each next phase of the different phase settings, the generated digital video for the calculating of the quality measure is after waiting a relatively small amount time after the setting of the phase of the sampling clock.

11. The method of claim 9, wherein the analog video includes R, G, and B signals, such that the sampling is of R, G, and B values, wherein the method further includes converting the sampled R, G and B values to coordinates that include an intensity coordinate of an intensity measure, and wherein the quality measure is based on statistics of pixel to pixel differences in the intensity coordinate values.

12. The method of claim 9, wherein the statistics include for a frame of the digital video a count of the number of pixel to pixel differences that have magnitude exceeding the predetermined threshold within the whole or part of the frame, and wherein the selecting selects the phase that maximizes the count.

13. The method of claim 9, wherein the statistics include for a frame of the digital video a count of the number of pixel to pixel differences that have magnitude exceeding the predetermined threshold within the whole or part of the frame, and wherein the selecting selects the phase that is about 180 degrees from the phase that minimizes the count.

14. The method of claim 9, wherein the pre-selected threshold is a pre-selected portion of the maximum possible pixel-to-pixel difference magnitude.

15. The method of claim 14, wherein the analog video includes R, G, and B signals, such that the sampling is of R, G, and B values, wherein the method further includes converting the sampled R, G and B values to coordinates that include an intensity coordinate of an intensity measure, and wherein the quality measure is based on statistics of pixel to pixel differences in the intensity coordinate values, and wherein the pre-selected threshold is about ¼ of the maximum possible pixel-to-pixel difference magnitude of the intensity coordinate.

16. The method of claim 9, wherein the sampling of the analog video in the repeating is at a sample clock rate that is determined from a horizontal synchronization indication from the source of analog video to be equal to the pixel rate, such that no oversampling is needed, and a single sample clock rate is used.

17. The method of claim 9, wherein the sampling of the analog video in the repeating is at a sample clock rate that is an integer multiple of the sample clock rate.

18. The method of claim 9, wherein the repeating is carried out multiple times to determine histograms of quality measures, and the histograms compared to select the phase to use.

19. An apparatus comprising:

a receiver configured to accept analog video from a source of analog video and to output digital video, the source of analog video including one or more digital to analog converters and configured to output the analog video and a horizontal synchronization indication, the receiver configured to sample the analog video using one or more analog to digital converters at a sample clock rate and sample clock phase;

a color space converter configured to convert output values of the one or more analog to digital converters to coordinates that include an intensity coordinate of an intensity measure;

a clock signal generator coupled to the video rate analyzer configured to accept an indication of the number of samples in a video line and a phase signal and generate a sample clock signal at the sample clock rate and sample clock phase for the one or more analog to digital converters and a phase calculating processor configured to:

accept the horizontal synchronization indication and to determine an indication of the number of samples in a video line;

repeat for a plurality of different phase settings determining for a frame a respective sampling quality measure, wherein the determining of the sampling quality measure includes:

setting the phase of a sampling clock to a next phase of the different phase settings, wherein initially, the next phase is a first phase;

accepting analog video and a horizontal synchronization indication from a source of analog video;

sampling the analog video at the sample clock rate with the next phase; and determining a quality measure based on statistics of pixel to pixel differences sampled intensity coordinate values that have magnitude exceeding a pre-determined threshold;

select a phase to use based on the determined quality measures for the plurality of phase settings; and a video encoder coupled to the color space converter configured to accept digital video in the coordinates and to encode the digital video for transmission to one or more remote terminals.

20. The apparatus of claim 19, wherein for each next phase of the different phase settings, the sampled intensity coordinate values for the calculating of the quality measure are obtained after waiting a relatively small amount time after the setting of the phase of the sampling clock.

21. A non-transitory computer readable medium encoded with instructions that when executed by one or more processors of a processing system cause execution of a method comprising: repeating for a plurality of different phase settings determining a respective sampling quality measure; selecting a phase to use based on the determined quality measures for the plurality of phase settings; and setting the phase at the selected phase, wherein the determining of the sampling quality measure includes: setting the phase of a sampling clock to a next phase of the different phase settings, wherein initially, the next phase is a first phase; accepting analog video from a source of analog video; sampling the analog video using one or more analog to digital converters at a sample clock rate with the next phase; and generating digital video from the sampled analog video; and determining a quality measure based on statistics of pixel to pixel differences in a coordinate of the generated digital video that have magnitude exceeding a pre-determined threshold.

22. The non-transitory computer readable medium of claim 21, wherein for each next phase of the different phase settings, the generated digital video for the calculating of the quality measure is after waiting a relatively small amount time after the setting of the phase of the sampling clock.

23. The non-transitory computer readable medium of claim 21, wherein the analog video includes R, G, and B signals, such that the sampling is of R, G, and B values, wherein the method further includes converting the sampled R, G and B values to coordinates that include an intensity coordinate of an intensity measure, and wherein the quality measure is based on statistics of pixel to pixel differences in the intensity coordinate values.

* * * * *